United States Patent
Otremba

(10) Patent No.: US 8,354,692 B2
(45) Date of Patent: Jan. 15, 2013

(54) VERTICAL SEMICONDUCTOR POWER SWITCH, ELECTRONIC COMPONENT AND METHODS OF PRODUCING THE SAME

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 849 days.

(21) Appl. No.: 11/276,806

(22) Filed: Mar. 15, 2006

(65) Prior Publication Data
US 2007/0215980 A1    Sep. 20, 2007

(51) Int. Cl.
*H01L 29/74* (2006.01)

(52) U.S. Cl. ........ 257/178; 257/751; 257/753; 257/763; 257/765; 257/766; 257/770; 257/779

(58) Field of Classification Search .................. 257/178, 257/751, 753, 763, 765, 766, 770, 779
See application file for complete search history.

(56) References Cited

U.S. PATENT DOCUMENTS

| 4,132,813 | A | 1/1979 | Schaal | 427/90 |
| 6,121,070 | A | 9/2000 | Akram | 438/108 |
| 6,548,386 | B1* | 4/2003 | Kondo et al. | 438/572 |
| 7,045,831 | B2* | 5/2006 | Narazaki | 257/177 |
| 2005/0212076 | A1 | 9/2005 | Schulze et al. | 257/502 |
| 2005/0215042 | A1 | 9/2005 | Hille et al. | |
| 2006/0017174 | A1 | 1/2006 | Otremba | 257/778 |
| 2007/0054138 | A1* | 3/2007 | Lau et al. | 428/472.3 |

FOREIGN PATENT DOCUMENTS

| DE | 3640248 | 6/1987 |
| DE | 3823347 | 1/1990 |
| DE | 102004012818 | 10/2005 |
| DE | 102004012819 | 10/2005 |
| DE | 102004021054 | 11/2005 |
| DE | 102004030042 | 1/2006 |
| GB | 2184288 | 6/1987 |

OTHER PUBLICATIONS

Sawle, Andrew et al., DirectFET—A Proprietary New Source Mounted Power Package for Beard Mounted Power, 5 pages.

* cited by examiner

*Primary Examiner* — Samuel Gebremariam
(74) *Attorney, Agent, or Firm* — Banner & Witcoff, Ltd.

(57) ABSTRACT

A vertical semiconductor power switch has a semiconductor body having a first surface and a second surface. At least one anode and one control electrode are positioned on the first surface and at least one cathode is positioned on the second surface. The cathode comprises a multi-layer contact structure which comprises an inner contact layer positioned directly on the second surface of the semiconductor body, and an outermost layer consisting essentially of a Ni-alloy.

33 Claims, 1 Drawing Sheet

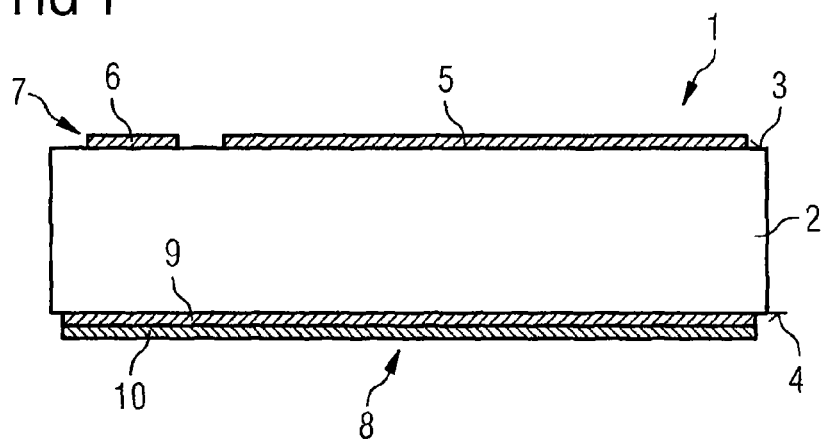
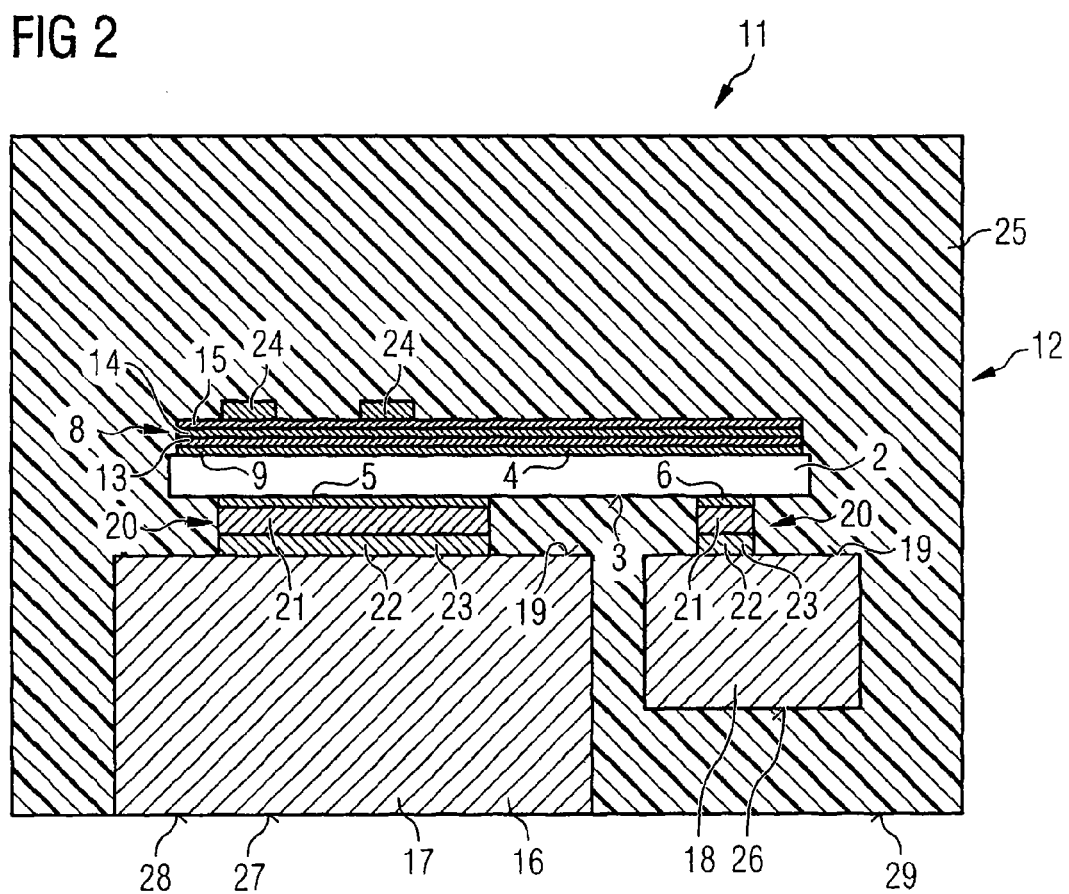

VERTICAL SEMICONDUCTOR POWER SWITCH, ELECTRONIC COMPONENT AND METHODS OF PRODUCING THE SAME

TECHNICAL FIELD

The application relates to vertical semiconductor power switches, to electronic components comprising one or more semiconductor power switches and to methods of manufacturing them.

BACKGROUND

A vertical semiconductor power switch may be provided by a vertical semiconductor transistor device such as a MOSFET (Metal Oxide Semiconductor Field Effect Transistor) or an IGBT (Isolated Gate Bipolar Transistor) device. Since the device is vertical, contacts or electrodes are positioned on two opposing surfaces of the body of the device. Semiconductor power switches are typically packaged to form an electronic component which includes a rewiring structure which enables the two opposing surfaces of the switch to be electrically contacted from the outer contacts, e.g. pins, of the electronic component.

There is a general demand for increasingly miniaturized electronic components and/or increased performance from a package of a given size. This demand has lead to the development of electronic modules or so-called System-in-Packages which include several semiconductor components. The increasing miniaturization and performance of the electronic component has lead to a requirement for improved heat dissipation from the packages in order to avoid failure of the device due to over-heating. A consequence of these developments is an increase in the number of different types of package in which vertical semiconductor power devices are accommodated.

SUMMARY

A vertical semiconductor power switch comprises a semiconductor body having a first surface and a second surface, wherein at least one anode and at least one control electrode are positioned on the first surface and at least one cathode is positioned on the second surface, wherein the cathode comprises a multi-layer contact structure, the multi-layer contact structure comprising: an inner contact layer positioned directly on the second surface of the semiconductor body, and an outermost layer consisting essentially of a Ni-alloy.

An electronic component comprises at least one vertical semiconductor power switch comprising a first surface and a second surface, wherein at least one anode and at least one control electrode are positioned on the first surface and at least one cathode is positioned on the second surface; a heat sink comprising an upper surface and a lower surface and at least one die attach portion; a plurality of leads; wherein the anode of the semiconductor power switch is mounted on the die attach portion of the heat sink, and wherein the cathode comprises a multi-layer contact structure, the multi-layer contact structure comprising: an inner contact layer positioned directly on the second surface of the semiconductor power switch, and an outermost layer consisting essentially of a Ni-alloy.

A method to manufacture a vertical semiconductor power switch, comprises the steps of providing at least one vertical semiconductor power switch comprising a semiconductor body having a first surface and a second surface, wherein at least one anode and at least one control electrode are positioned on the first surface, and depositing a multi-layer contact structure on the second surface to form at least one cathode by depositing an inner contact layer directly on the second surface of the semiconductor body, and depositing an outermost layer consisting essentially of a Ni-alloy on the inner contact layer.

A method of manufacturing an electronic component, comprises the steps of providing at least one vertical semiconductor power switch comprising a semiconductor body having a first surface and a second surface, wherein at least one anode and one control electrode are positioned on the first surface and at least one cathode is positioned on the second surface, wherein the cathode comprises a multi-layer contact structure which comprises an inner contact layer positioned directly on the second surface of the semiconductor body and an outermost layer consisting essentially of a Ni-alloy, providing a heat sink comprising an upper surface and a lower surface and at least one die attach portion; providing a plurality of leads; mounting the anode of the vertical semiconductor power switch on the die attach portion of the heat sink, and electrically connecting the cathode to at least one cathode lead.

BRIEF DESCRIPTION OF THE DRAWINGS

FIG. 1 illustrates a cross-sectional view of a vertical MOSFET device according to a first embodiment, and FIG. 2 illustrates an electronic component comprising a vertical MOSFET device according to a second embodiment.

DETAILED DESCRIPTION

In one embodiment a vertical a semiconductor power switch is provided which comprises a semiconductor body having a first surface and a second surface. The second surface is positioned opposing the first surface. At least one anode and at least one control electrode are positioned on the first surface and at least one cathode is positioned on the second surface. The cathode comprises a multilayer contact structure. In an embodiment, the multi-layer contact structure comprises an inner contact layer positioned directly on the second surface of the semiconductor body and an outermost layer consisting essentially of a Ni-(nickel) alloy.

In an embodiment, the semiconductor body comprises a semiconductor material, for example silicon, in which regions have been doped to provide n-conductive and p-conductive regions so as to provide the desired semiconductor device. According to the embodiment, the multilayer contact structure which provides the cathode has an outermost layer consisting essentially of a nickel alloy. A nickel alloy has the advantage that it is environmentally stable so that further outermost noble metal layers, such as silver or gold, can be omitted. A nickel alloy has the further advantage that it is contactable by a range of materials and contacting methods which may be used for semiconductor power devices. The semiconductor power switch according to the embodiment may, therefore, be used in a variety of types of package in which different contact materials and contacting methods are used. In this context, contactable is used to mean that a reliable physical and electrical contact is produced between the Ni-ally of the cathode and an additional contact element.

Electrically conductive contact elements are typically included within the package housing and extend between the electrodes positioned on the upwardly facing surface of the vertical semiconductor power switch and the outer contacts of the semiconductor package.

The outer contacts enable the semiconductor power switch to be electrically accessed from outside of the package. The outer contacts may be provided by pins which extend outwards form the package housing or by electrically conductive contact areas which lie essentially flush with the lower surface of the package housing. The package housing is typically provided by a plastic encapsulation compound, for example an epoxy resin.

Different types of semiconductor power packages or components, in which a vertical semiconductor power switch is accommodated, include different types of electrical contacts from the semiconductor power switch to the pins. The electrical contact elements may be provided by bond wires, conductive clips or conductive ribbons for example. The different types of contact elements are connected to the electrodes of the semiconductor power switch using different methods.

Bond wires are usually attached using wire-bonding techniques such as thermo-compression bonding and wedge-bonding during which intermetallic phases form at the interface between the bond wire and the electrode due to a reaction at the interface between the material of the bond wire and the material of the electrode. A conductive clip, in contrast, is typically attached to the electrode by soft solder joint positioned between the conductive clip and the electrode.

In an embodiment of the vertical semiconductor power switch the cathode may be electrically contacted by bond wires and solder as the outermost layer of the cathode is provided by a Ni-alloy. The vertical semiconductor power switch according to the embodiment is, therefore, suitable for packages in which different types of contacting methods are used without additional modification.

The type of electrical contact formed between the cathode and the outer contact areas may vary due to the orientation of the semiconductor power switch within the package. In one type of semiconductor power package, for example a TO-220 type package, the cathode of the vertical semiconductor power switch is attached to the die pad of the package in an arrangement commonly known as a drain-down arrangement. In this types of package, the cathode may be mounted on the die pad or heat sink of an electronic component by soft solder.

In an embodiment, the vertical semiconductor power switch may have what is known as a flip-chip type arrangement and may be arranged so that the cathode faces upwards. This type of an arrangement is also called a source-down arrangement. In this type of package, the cathode may be electrically connected to the pins of the electronic component by bond wires or by a conductive clip.

The cathode, according to an embodiment, has an outermost layer consisting essentially of a nickel alloy which may be contacted by known wire-bonding techniques, such as thermocompression wire-bonding and wedge wire-bonding. Furthermore, a nickel alloy is also wettable by soft solder. Therefore, the vertical semiconductor power switch according to an embodiment can be used in a variety of different types of semiconductor package. This enables the cost of the semiconductor package to be reduced since different types of semiconductor power switch do not have to be bought and stored for different types of semiconductor package.

The nickel alloy may have a composition which enables intermetallic phases to be formed with aluminum or copper under the conditions typically used in thermocompression wire-bonding and/or wedge bonding. This enables aluminum bond wires and copper bond wires to be used to electrically connect the cathode to the pins of the semiconductor package. Aluminum and copper have the advantage that they are relatively inexpensive and available in large diameters. The electrical performance of the package may be increased by providing bond wires of a larger diameter without increasing the cost of the package dramatically.

In an embodiment, the nickel alloy consists essentially of a nickel and one of the elements phosphorous and vanadium. These nickel alloys are contactable by thermocompression wire-bonding and wedge bonding and also wettable by soft solder. These Ni-based alloys are also environmentally stable and so an additional protective outer layer of a noble metal can be omitted.

The inner contact layer of the multilayer structure which provides the cathode has the function of providing a low resistance ohmic contact to the material of the semiconductor body of the semiconductor power switch. For a semiconductor body comprising silicon, the inner contact layer may consist essentially of one of aluminum, chromium, titanium and nickel or an alloy comprising at least one of these elements. The inner contact layer may consist essentially of an aluminum-silicon alloy or an aluminum-silicon-copper alloy.

The multilayer contact structure of the cathode may further comprise at least one adhesion promotion layer positioned directly between the inner contact layer and the outermost layer. The adhesion promotion layer may consist essentially of titanium, Ti, or titanium nitride, $TiN_x$. In an alternative embodiment, the adhesion promotion layer may consist of two layers. A first layer, which may consist essentially of titanium, is positioned directly on the inner contact layer and a second layer, which may consist essentially of titanium nitride, is positioned directly on the first titanium layer.

In another embodiment, the outermost layer of the multilayer contact structure of the cathode consists of two layers. A first layer consists essentially of nickel and is positioned directly on the adhesion promotion layer. A second layer consists essentially of a nickel alloy and is positioned on the nickel layer. In this embodiment, the multilayer structure, therefore, consists of four layers; an inner contact layer, adhesion promotion layer, a nickel layer and an outermost nickel alloy layer. The nickel alloy may consist essentially of nickel and phosphorous or nickel and vanadium.

This structure has the advantage that the thickness of the cathode may be increased used by increasing the thickness of the nickel layer. Ni is relatively inexpensive. The outermost nickel alloy layer provides a contact surface which is contactable by wire-bonding and by soft solder so that the semiconductor powers which may be used in a variety of packages and may be contacted by a variety of contact elements and contacting methods.

In an embodiment, the cathode consists of three layers. An inner contact layer is positioned directly on the semiconductor body of the vertical semiconductor power switch, a layer consisting essentially of nickel is positioned directly on the inner contact layer, and a nickel alloy layer is positioned directly on the nickel layer. In this embodiment, the outermost layer, therefore, also consists of two layers. The nickel alloy may consist essentially of nickel and phosphorous or nickel and vanadium.

The vertical semiconductor power switch may be a MOSFET device or an IGBT device. In the case of a MOSFET device, the anode is conventionally denoted as the source, the cathode as the drain and the control electrode as the gate. In the case of an IGBT device, the anode is conventionally denoted as the emitter, the cathode as the collector and the control electrode as the gate.

In an embodiment, an electronic component is provided which comprises at least one vertical semiconductor power switch, a heat sink and a plurality of leads. The vertical semiconductor power switch comprises a first surface and a second surface which opposes the first surface. At least one anode and at least one control electrode are positioned on the first surface and the least one cathode is positioned on the second surface. The cathode may extend over substantially the whole of the second surface.

The heat sink comprises an upper surface and the lower surface and at least one die attach portion. In this context, "upper" is used to denote the surface which faces away from a higher-level circuit board on which the electronic component will be mounted. "Lower" is used to denote a surface which faces towards the higher-level circuit board. Each of the plurality of leads includes an outer contact surface which enables the semiconductor power switch to be electrically accessed from outside of the electronic component, typically via the higher level circuit board.

In an embodiment, the anode of the semiconductor power switch is mounted on the upper surface of the die attach portion of the heat sink. The cathode, therefore, faces upwards away from the heat sink and away from the higher-level circuit board. The cathode comprises a multilayer contact structure which comprises an inner contact layer positioned directly on the second surface of the semiconductor power switch and an outermost layer consisting essentially of a nickel alloy.

The outermost layer of the cathode, therefore, provides a surface which can be electrically contacted by wire-bonding techniques and by soft solder since the nickel alloy is wettable soft solder. Advantageously, the nickel alloy is able to form intermetallic phases with aluminum or copper under normal wire-bonding conditions. This enables the cathode to be electrically contacted by aluminum bond wires and by copper bond wires using wire-bonding techniques such as the thermo-compression wire-bonding or wedge wire-bonding.

In an embodiment of the electronic component, a variety of types of electrical contact may, therefore, be used due to the provision of an outermost layer consisting essentially of a nickel alloy for the cathode of this semiconductor power switch. The outermost layer may consist essentially of nickel and phosphorous or nickel and vanadium. The vertical semiconductor power switch may be a MOSFET device or an IGBT device.

The cathode may be electrically connected to a cathode lead by at least one bond wire which extends between the outermost layer of the multilayer contact structure and a cathode lead. The bond wire may consist essentially of aluminum, an aluminum alloy, copper or a copper alloy. Pure metals have the advantage of a low electrical resistance whereas alloys have the advantage that the mechanical properties of the wire are improved so that breakage during production may be avoided.

In an embodiment, the cathode is electrically connected to the cathode lead by at least one electrically conductive contact clip. The contact clip may comprise copper. The contact clip extends between the outermost layer of the multilayer contact structure of the cathode and at least one cathode lead. The contact clip may be mounted on the cathode, that is on the outermost layer of the multilayer contact structure which comprises the cathode, by a soft solder. The cathode may be electrically connected to two or more cathode leads. The electrical contact between the cathode and pins or contacts of the electronic component may be provided by a plurality of bond wires or a contact clip or a combination of bond wires and contact clips.

In an embodiment, the anode is mounted on, and electrically connected to, the upper surface of the die attach portion of the heat sink by a soft solder connection or a diffusion solder bond.

The phrase "diffusion solder bond" is used in this context to denote a connection structure which is mechanically and electrically attached to a surface by a layer comprising intermetallic phases. The intermetallic phases are located at the interface between the connection structure and the surface. The intermetallic phases are formed as a result of a diffusion soldering process and comprise chemical elements of the diffusion solder and of at least one contiguous material, for example the heat sink or lead.

A diffusion solder bond has the advantage that the melting point of the intermetallic phases is higher than the melting point of the diffusion solder itself. Consequently, the bond which is formed as a result of the diffusion solder process has a melt temperature which is higher than the temperature at which the bond is formed. A diffusion solder bond, therefore, has the advantage that a second diffusion bonding step may be carried out without the already produced diffusion solder bond melting. Diffusion solder bonding is, therefore, particularly advantageous for multi-chip modules in which two or more chips or semiconductor components are mounted adjacent to one another directly on the die pad or for multi-chip modules in which two components are stacked one on top of the other. The problems associated with soft solder bonding, in particular, movement of the semiconductor components during subsequent die attach steps, are avoided.

Diffusion solder bonds are typically thinner than soft solder bonds. Diffusion solder bonds are typically less than 10 µm in thickness whereas soft solder bonds typically have a thickness of around 100 µm. The smaller thickness of the diffusion solder bond has the advantage that the thermal dissipation from the semiconductor component into the die pad is improved and the thermal performance of the package is improved.

A diffusion solder bond has the further advantage that the lateral area occupied by the bond substantially corresponds to the lateral area of the semiconductor component. In contrast to soft solder joints, the structure for producing the diffusion solder bond, is fabricated by depositing the structure on the semiconductor component, in this case, the anode and/or control electrode of the semiconductor power switch.

In an embodiment, the diffusion solder bond comprises a contact layer, a diffusion barrier layer disposed on the contact layer, and a diffusion solder layer disposed on the diffusion barrier layer. The anode may provide the contact layer or the anode may comprise the diffusion solder bond.

The contact layer consists essentially of aluminum and the diffusion barrier layer comprises one of the group of consisting of Ti metal and a first layer of consisting essentially of Ti metal and a second layer comprising $TiN_x$. The diffusion solder layer comprises an alloy, the alloy comprising tin, Sn, and one of the group consisting of Ag, Au, Cu and In. After the diffusion solder process, the diffusion solder forms the diffusion solder bond and comprises intermetallic phases.

The electrically conductive layer may have a thickness t where $0.1\ \mu m \leq t \leq 100\ \mu m$, preferably $0.1\ \mu m \leq t \leq 10\ \mu m$, more preferably $1.5\ \mu m \leq t \leq 3.5\ \mu m$.

The contact layer may have a thickness a, where $0.01\ \mu m \leq a \leq 10\ \mu m$, preferably $0.1\ \mu m \leq a \leq 1\ \mu m$. The diffusion barrier layer may have a thickness b, where $0.1\ \mu m \leq b \leq 10\ \mu m$, preferably $0.1\ \mu m \leq b \leq 1\ \mu m$. The diffusion solder layer may have a thickness c, where $0.1\ \mu m \leq c \leq 80\ \mu m$, preferably $0.5\ \mu m \leq c \leq 5\ \mu m$.

In an embodiment, the diffusion solder bond comprises a contact layer and a diffusion solder layer. The contact layer comprises one of a metal and an alloy thereof, the metal being one of the group of elements consisting of Ti, Ni and Cr, and the diffusion solder layer comprises an alloy, the alloy comprising Sn and one of the group consisting of Ag, Au, Cu and In.

In an embodiment of the previous arrangement of the diffusion solder bond, at least one further layer is disposed between the contact layer and the diffusion solder layer. The further layer comprises one of a metal and an alloy thereof, the metal being one of the group of elements Ni, Au, Ag, Pt and Pd.

The electrical contact to the control electrode of the semiconductor power switch may be provided by different arrangements of the rewiring structure of the electronic component. At least one of the plurality of leads of the electronic component may be a control lead to which the control electrode is electrically connected.

In an embodiment, an inner portion of the control lead is spaced from the die attach portion of the heat sink by distance. The upper surface of the inner portion of the control lead lies in a plane generally coplanar with the upper surface of the die attach portion of the heat sink. The control electrode is mounted on the upper surface of the inner portion of the control lead. The control lead also comprises an outer portion which provides an outer contact area of the electronic component via which the control electrode of the vertical semiconductor power switch may be electrically accessed.

The control lead is spaced from the die attach portion of the heat sink by distance so that the die attach portion of the heat sink may be aligned with the anode electrode and the inner portion of the control lead may be aligned with the control electrode disposed on the first surface of the vertical semiconductor power switch. The semiconductor power switch, therefore, extends between the die attach portion of the heat sink and the inner portion of the control lead.

In an embodiment, the heat sink of the electronic component comprises two die attach portions. The anode of the semiconductor power switch is mounted on the first die attach portion and the control electrode of the semiconductor power switch is mounted on a second die attach portion. The second portion of the heat sink and, therefore, the control electrode, may be electrically accessed by a further contact element which extends between the second die attach portion and one or more of the plurality of leads to provide a control lead.

The control electrode may be mounted on the inner portion of the control lead or the die attach portion of the heat sink by a diffusion solder bond. The diffusion solder bond may be essentially the same as the diffusion solder bond by which the anode is mounted on, and electrically connected to, the upper surface of the die attach portion of the heat sink. This arrangement has the advantage that the anode may be mounted on the die attach portion of the heat sink and the control electrode may be mounted or on the control lead or second portion of the heat sink in the same process step.

The cathode is, therefore, positioned on the upwardly facing side of the vertical semiconductor power switch and is electrically connected to at least one lead of the plurality of leads by an additional contact element. The contact element may be one or more bond wires or a conductive clip. According to an embodiment, the electronic component includes a semiconductor power switch in which the outermost layer of the cathode comprises a nickel alloy. The multilayer contact structure which provides the cathode may have one of the arrangements previously described.

The electronic component may further comprise a plastic housing compound. The plastic housing compound encapsulates at least the inner portions of the leads and the vertical semiconductor power switch. The outer portions of the leads extend outside the plastic housing composition to provide the outer contact areas of the electronic component. In one embodiment, the lower surface of the heat sink remains unencapsulated by the plastic housing composition and may, therefore, provide an outer contact area of the electronic component. If the semiconductor power switch is an n-type device, the lower surface of the heat sink provides a ground contact. The plastic housing composition may comprise epoxy resin or a transfer molding compound as are known in the art.

The following embodiments of methods provide for manufacturing of a vertical semiconductor power switch and for manufacturing of an electronic component.

In an embodiment, a vertical semiconductor power switch is manufactured by providing a semiconductor body having first surface and a second surface. At least one anode and at least one control electrode are positioned on the first surface. A multilayer contact structure is deposited on the second surface of the semiconductor body to form at least one cathode. An inner contact layer is deposited directly on the second surface of the semiconductor body and an outermost layer consisting essentially of a nickel alloy is deposited on the inner contact layer.

The deposition of the multilayer contact structure may be performed at the wafer level. A wafer is provided which comprises a plurality of device positions each comprising a semiconductor power switch. A structured metallization may then be fabricated on a first side of the wafer to provide an anode and control electrode in each device position. A second metallization structure may then be manufactured on the second side of the wafer to provide a cathode with a multi-layer structure according to an embodiment in each device position. The plurality of semiconductor power switches are then singulated from the wafer.

A multilayer contact structure may be deposited using a vacuum deposition technique such as sputtering, thermal evaporation or electron beam evaporation to form the cathode. The multilayer structure may be deposited without breaking the vacuum of the deposition chamber. Alternatively, the wafer may be transferred between different vacuum chambers, while being exposed to the ambient, between different deposition steps. The contact structure may also be deposited by electrodeposition.

In an embodiment, after the deposition of the inner contact layer, at least one further adhesion promotion layer is deposited directly on the inner contact layer before the deposition of the outermost layer. The outermost layer is, therefore, deposited on the outer adhesion promotion layer.

The outermost layer may consist of two layers, the first layer consisting essentially of nickel and the second layer consisting essentially of a nickel alloy. The first nickel layer is deposited on the adhesion promotion layer and the second outermost layer of the cathode contact structure, which consists essentially of a nickel alloy, is deposited on the nickel layer.

The adhesion promotion layer may comprise titanium and/or titanium nitride. Titanium nitride may be fabricated by depositing titanium nitride or by depositing titanium followed by a nitridation treatment.

In an embodiment, the multilayer contact structure which forms the cathode consists of three layers. An inner contact layer is deposited directly on the second surface of the semiconductor body, a layer of nickel is deposited on the inner contact layer and an outermost layer consisting essentially of a nickel alloy is deposited on the nickel layer.

As previously described, the nickel alloy may consist essentially of nickel and phosphorous or nickel and vanadium.

The anode and the control electrode may be deposited on the first side of the semiconductor power switch by conventional methods and each may have a known structure. The anode and control electrode may comprise aluminum or copper.

In an embodiment, a layer of diffusion solder is deposited on the anode and the control electrode of the semiconductor power switch so as to provide an outermost diffusion solder layer. Furthermore, a diffusion barrier layer may be deposited on the anode and the control electrode before a diffusion solder is deposited on the diffusion barrier layer.

A method of manufacturing an electronic component comprises the following steps. At least one semiconductor power switch is provided which comprises a semiconductor body having a first surface and a second surface. At least one anode and at least one control electrode are positioned on the first surface and at least one cathode is positioned on the second surface. The cathode comprises a multilayer contact structure which comprises an inner contact layer positioned directly on the second surface of the semiconductor body and an outermost layer consisting essentially of a nickel alloy. A heat sink is provided which comprises an upper surface and lower surface and at least one die attach portion. A plurality of leads is also provided.

The anode of the vertical semiconductor power switch is mounted on the upper surface of the die attach portion of the heat sink. The cathode is then electrically connected to at least one lead of the plurality of leads. In a first embodiment, the cathode is electrically connected to at least one cathode lead by at least one bond wire which extends between the outermost layer of the multilayer contact structure of the cathode and the at least one cathode lead.

In another embodiment, the cathode is electrically connected to at least one cathode lead by a contact clip which extends between the outermost layer of the multilayer contact structure and the at least one cathode lead. The contact clip may be attached to the outermost layer of the multilayer contact structure by soft solder and may be connected to the cathode lead by soft solder.

In an embodiment, the anode is mounted on, and electrically connected to, the die attach portion of the heat sink by a diffusion solder process. The diffusion solder process may be carried out by providing the anode with an outer layer comprising a diffusion solder. The diffusion solder has a melt temperature.

The diffusion solder process may be carried out by heating the die attach portion of the heat sink to a temperature which is greater than the melting point of the diffusion solder. The anode of the vertical semiconductor power switch is then brought into contact with the upper surface of the die attach portion of the heat sink. More specifically, the outer surface of the diffusion solder layer is brought into surface to surface contact with the upper surface of the die attach portion of the heat sink. Intermetallic phases are produced which have a higher melting point than the melting point of the diffusion solder. The intermetallic phases are produced at the interface between the diffusion solder and the die attach portion of the heat sink and comprise the elements of the diffusion solder and the die attach portion. As the intermetallic phases have a higher melting point than the melting point of the diffusion solder, the anode is attached to the die attach portion by the solidification of the diffusion solder layer and the interface between the anode and the die attach portion of the heat sink.

In an embodiment, at least one control lead is provided and the inner portion of the control lead is spaced from the die attach portion of the heat sink by a distance so that the upper surface of the inner portion of the control lead lies in a plane generally coplanar with the upper surface of the die attach portion of the heat sink. The control lead is also positioned so that the inner portion of the control lead is aligned with the control electrode and the die attach portion of the heat sink is aligned with the anode of the first surface of the vertical semiconductor power switch. The control electrode is then mounted on the upper surface of the inner portion of the control lead. This may be carried out by a diffusion solder process and may be carried out during the diffusion solder process in which the anode is mounted on the die attach portion of the heat sink.

In an embodiment, the heat sink is provided with two die attach portions. The anode of the semiconductor power switch is mounted on a first die attach portion and the control electrode of the semiconductor power switch is mounted on a second die attach portion. Again, this may be performed during the same process step and may be performed by a single diffusion solder process.

After the first surface of the vertical semiconductor power switch has been mounted on the heat sink and the control electrode has been electrically connected to a control lead, the electrical contact is made between the cathode positioned on the second side of the vertical semiconductor power switch and at least one cathode lead. If further semiconductor components, such as a diode or further vertical semiconductor power switches, are to be included in the electronic component, they are then mounted with the desired arrangement.

A plastic housing may then be provided. The plastic composition which provides a plastic housing of the electronic component may encapsulate at least the vertical semiconductor power switch, inner portions of the leads and the upper surface of the heat sink. If bond wire connections are provided between the cathode and the leads, the bond wire connections may also be encapsulated in the plastic. If a contact clip is provided between the cathode and the leads, the upper surface of the contact clip may remain uncovered by the plastic housing composition in order to improve heat dissipation from the electronic component. The outer contact areas of the leads and/or lower surface of the heat sink remain uncovered by the plastic encapsulation material.

The semiconductor power switch is, therefore, suitable for use in packages in which the cathode electrode is mounted on the heat sink or in which the anode is mounted on the heat sink. In the latter type of package, the cathode may be electrically attached to the pins of contacts of the package by either bond wires or a conductive clip since the outermost Ni-alloy layer is contactable by wire-bonding techniques and by solder. The outermost Ni-alloy has the further advantage that reliable electrical contacts may be formed with aluminum bond wires and copper bond wires using known wire-bonding techniques.

FIG. 1 illustrates a vertical MOSFET device 1 comprising a semiconductor body 2 having a first surface 3 and a second surface 4 which is positioned opposing the first surface 3. The semiconductor body 2 comprises silicon in which regions, not illustrated in the figures for clarity, are doped to provide the desired switching characteristics of the MOSFET device 1.

A source electrode 5 and a gate electrode 6 are positioned on the first surface 3 of the semiconductor body 2 which provide electrical contact to the transistor structure within the semiconductor body 2 of the MOSFET device 1. The source electrode 5 occupies a much larger area of the first surface 3 than the gate electrode 6. The source electrode 5 and gate electrode 6 are provided by a structured aluminum metallization layer 7 as is known the art.

A drain electrode 8 is positioned on the second surface 4 of the semiconductor body 2. The drain electrode 8 extends over essentially the whole of the second surface 4. The drain electrode 8 consists of two layers 9 and 10. The first layer 9 provides an inner contact layer which is disposed directly on the second surface 4 of the silicon body 2. The inner contact layer 9 provides a low resistance ohmic contact to the silicon of the semiconductor body 2. In this embodiment, the inner contact layer 9 consists essentially of aluminum with a small proportion of silicon. The second layer 10 of the drain electrode 8 is positioned directly on the inner contact layer 9 and provides the outermost layer of the drain electrode 8. In the first embodiment, the outermost layer 10 of the drain electrode 8 consists essentially of a Ni-based alloy, in this embodiment, a nickel phosphorous alloy.

The outermost nickel phosphorous alloy layer 10 provides a drain electrode structure 8 which can be reliably and easily electrically contacted by aluminum and copper bond wires using known wire-bonding techniques. The nickel phosphorous alloy layer 10 has the additional advantage that it is wettable by conventional soft solders. Therefore, the MOSFET device 1 is flexible in that it can be used in electronic components in which it is desired to electrically contact the drain electrode 8 of the MOSFET device 1 by bond wires or by solder connections.

The multi-layer contact structure of the drain electrode 8 was fabricated by sequential deposition of the inner contact layer 9 and outermost contact layer 10 on the second surface 4 of the MOSFET 1 by sputtering.

FIG. 2 illustrates an electronic component 11 which comprises a vertical MOSFET device 12 according to the second embodiment. Parts of the MOSFET device 12 which are essentially the same as the MOSFET device 1 of the first embodiment are denoted by the same reference number.

The MOSFET device 12 comprises a silicon semiconductor body 2 having a first surface 3 and second surface 4 which is positioned opposing the first surface 3. An anode electrode 5 and gate electrode 6, each comprising aluminum, are disposed on the first surface 3. A drain electrode 8 is disposed on the second surface 4 of the MOSFET device 12.

In the second embodiment, the drain electrode 8 consists of four layers. An inner contact layer 9 is positioned directly on the second surface 4, and is directly in contact with the silicon, of the semiconductor body 2. The inner contact layer 9 provides a low resistance ohmic contact to the silicon 2. An adhesion promotion layer 13 is positioned on the inner contact layer 9. This embodiment, the adhesion promotion layer 13 consists essentially of titanium. The drain electrode 8 also comprises an outermost layer 10 which, in the second embodiment, consists of two layers 14 and 15. The first layer 14 of the outermost layer 10 consists essentially of nickel and is disposed on the adhesion promotion layer 13. The second layer 15 of the outermost layer 10 consists essentially of a nickel vanadium alloy. The second layer 15 is disposed directly on the nickel layer 14. Therefore, the outermost surface of the drain electrode is provided by the nickel alloy, in this case nickel vanadium, which is contactable by wire-bonding techniques as well as soft solder.

The electronic component 11 comprises, in addition to the MOSFET device 12, a heat sink 16 which comprises two die attach portions 17 and 18 and a plurality of leads which cannot be seen in the cross-sectional view of FIG. 2.

The two die attach portions 17, 18 are positioned adjacent one another and, in this embodiment, the first die attach portion 17 has a thickness which is greater than the thickness of the second die attach portion 18. The upper surface 19 of the first die attach portion 17 and of the second die attach portion 18 of the heat sink 16 lie in essentially the same plane.

The MOSFET device 12 is mounted on the upper surface 19 of the heat sink 16. The MOSFET device 12, therefore, has a so-called source-down or flip-chip arrangement and the drain electrode 8, therefore, faces upwards away form the upper surface 19 of the heat sink 16. The source electrode 5 is positioned above the upper surface 19 of the first portion 17 of the heat sink 16 and the gate electrode 6 is positioned above the upper surface 19 of the second portion 18 of the heat sink 16. The MOSFET device 16, therefore, extends between the two adjacently arranged die attach portions 17, 18 of the heat sink 16. The source electrode 5 and gate electrode 6 are mounted on the upper surface 19 of their respective portions of the heat sink 16 by a diffusion solder bond 20.

The diffusion solder bond 20 comprises a diffusion barrier layer 21 which is positioned directly on the source electrode 5 and gate electrode 6. The diffusion barrier layer 21 comprises titanium nitride. A diffusion solder layer 22 is positioned on the diffusion barrier layer 21. The diffusion solder layer 22 comprises a tin-based diffusion solder, such as a silver tin diffusion solder or a gold tin diffusion solder. Since, in this embodiment, the MOSFET device 12 is attached to the heat sink 16, the diffusion solder layer 22 comprises intermetallic phases 23 which are the product of a reaction between the diffusion solder 22 and the material of the heat sink 16. The heat sink 16 and the non-illustrated leads consist essentially of copper.

After the MOSFET 12 has been attached to the heat sink 16, the drain electrode 8 is electrically connected to at least one of the plurality of leads. In this embodiment, the drain electrode of electrically connected to two drain leads by two bond wires 24 which extend between the outermost layer 15 of the drain electrode 8 and two of the plurality of leads which is designated as a drain lead. The bond wires 24 consist of aluminum and have an average diameter of 250 μm.

The electronic component 11 also comprises a plastic material 25 which provides the component housing. The plastic 25 encapsulates the MOSFET device 12, bond wires 24, upper surface of the first portion 17 of the heat sink 16, the upper surface 19 and lower surface 26 the second portion 18 of the heat sink 16. The lower surface 27 of the thicker first die attach portion 17 of the heat sink 16 is not covered by the plastic encapsulation material 25 and provides an outer contact area 28 of the electronic component 11. The lower surface 27 of the first die attach portion 17 of the heat sink 16 and the lower surface 29 of the plastic encapsulation material 25 are approximately coplanar and provide the lower outer surface 29 of the electronic component 11.

The MOSFET device 12 is n-type MOSFET device. Consequently, since the source electrode 5 is mounted on, and electrically connected to, the first portion 17 of the heat sink 16 by a diffusion solder bond 20, the lower exposed surface 27 of the first portion of the heat sink 16 provides a ground contact of the electronic component 11.

The second die attach portion 18 of the heat sink 16 extends outside of the side face of the plastic encapsulation material 25. The outer exposed portion of the second die attach portion 18 provides an outer gate contact area of the electronic component 11 which enables electrical access to the gate electrode 6 of the MOSFET device 12.

In a further embodiment which is not illustrated in the figures, the drain electrode consists of three layers. An inner contact layer 9 is positioned directly on the second surface 4 of the semiconductor body 2, an adhesion promotion layer 13 is positioned on the inner contact layer 9 and an outermost nickel alloy layer 10 is positioned on the adhesion promotion layer 13.

In a further embodiment of the electronic component which is not illustrated in the figures, the drain electrode 8 is electrically connected to one or more cathode leads by a conductive clip. The conductive clip is mounted on the outermost surface of the drain electrode 8 and the drain lead by a layer of soft solder.

In a further embodiment of the electronic component which is also not illustrated in the figures, the drain electrode 8 is mounted on the upper surface 19 of the heat sink 16 by a soft solder layer which is positioned between the outermost layer 10 of nickel alloy and the upper surface 19 of the heat sink 16. The MOSFET device is, therefore, mounted in a so-called drain down arrangement. In this embodiment, the source electrode 5 and gate electrode 6 are electrically connected by bond wires to source and gate leads of the electronic component respectively.

Reference Numbers
1 first MOSFET device
2 semiconductor body
3 first surface
4 second surface
5 source electrode
6 gate electrode
7 metallization
8 drain electrode
9 inner contact layer
10 outermost layer
11 electronic component
12 second MOSFET device
13 adhesion promotion layer
14 nickel layer
15 nickel alloy layer
16 heat sink
17 first portion of heat sink
18 second portion of heat sink
19 upper surface of heat sink
20 diffusion solder bond
21 diffusion barrier layer
22 diffusion solder
23 intermetallic phases
24 bond wire
25 plastic encapsulation compound
26 lower surface of second portion of heat sink
27 lower surface of first portion of heat sink
28 outer contact area
29 lower surface of electronic component

What is claimed is:

1. A vertical semiconductor power switch comprising a semiconductor body having a first surface and a second surface, wherein at least one anode and at least one control electrode are positioned on the first surface and at least one cathode is positioned on the second surface,
   wherein the cathode comprises a multi-layer contact structure, the multi-layer contact structure comprising:
      an inner contact layer positioned directly on the second surface of the semiconductor body, and
      an outermost layer consisting essentially of a nickel phosphorous alloy.

2. A vertical semiconductor power switch according to claim 1, wherein the nickel phosphorous alloy forms intermetallic phases with at least one of Al and Cu under the conditions of one or more of thermo-compression wire-bonding and wedge-bonding.

3. A vertical semiconductor power switch according to claim 1, wherein the nickel phosphorous alloy is contactable by at least one of thermo-compression wire-bonding and wedge bonding.

4. A vertical semiconductor power switch according to claim 1, wherein the nickel phosphorous alloy is wettable by soft solder.

5. A vertical semiconductor power switch according to claim 1, wherein the nickel phosphorous alloy is wettable by soft solder and contactable by at least one of thermo-compression wire-bonding and wedge bonding.

6. A vertical semiconductor power switch according to claim 1, wherein the inner contact layer consists essentially of one of the elements Al, Cr, Ti and Ni or an alloy thereof.

7. A vertical semiconductor power switch according to claim 1, wherein the outermost layer consists of two layers, wherein a first layer consists essentially of Ni and is positioned on the inner contact layer and a second layer consists essentially of a Ni-alloy is and positioned on the Ni layer.

8. A vertical semiconductor power switch according to claim 1, wherein the semiconductor power switch is one of a MOSFET and an IGBT.

9. A vertical semiconductor power switch according to claim 1, wherein the multi-layer contact structure further comprises at least one adhesion promotion layer positioned directly between the inner contact layer and the outermost layer.

10. A vertical semiconductor power switch according to claim 9, wherein the adhesion promotion layer consists essentially of at least one of Ti and $TiN_x$.

11. A vertical semiconductor power switch according to claim 9, wherein the outermost layer consists of two layers, wherein a first layer consists essentially of Ni and is positioned on the adhesion promotion layer and a second layer consists essentially of a Ni-alloy and is positioned on the Ni layer.

12. The vertical semiconductor power switch of claim 1, wherein the outermost layer is in direct contact with the innermost contact layer, and wherein the innermost contact layer is an aluminum layer.

13. The vertical semiconductor power switch of claim 12, wherein an interface between the innermost contact layer and the outermost layer comprises at least one intermetallic phase.

14. An apparatus, comprising:
   a semiconductor body having a first surface and a second opposing surface, the first surface comprising a first electrode and a second electrode, the second surface comprising a third electrode,
   wherein the third electrode comprises:
      a first layer consisting essentially of a nickel phosphorous alloy, and
      a second conductive layer disposed between the second surface of the semiconductor body and the first layer,
   wherein the first layer is an outermost layer of the third electrode.

15. The apparatus of claim 14, wherein the nickel phosphorous alloy comprises intermetallic phases with at least one of Al and Cu under a condition of one or more of thermo-compression wire-bonding and wedge-bonding.

16. The apparatus of claim 14, wherein the nickel phosphorous alloy is configured to be contacted by at least one of thermo-compression wire-bonding and wedge bonding.

17. The apparatus of claim 14, wherein the nickel phosphorous alloy is configured to be wettable by soft solder.

18. The apparatus of claim 14, wherein the nickel phosphorous alloy is configured to be wettable by soft solder and contactable by at least one of thermo-compression wire-bonding and wedge bonding.

19. The apparatus of claim 14, wherein the second layer consists essentially of one of the elements Al, Cr, Ti and Ni, or an alloy thereof.

20. The apparatus of claim 14, wherein the first layer comprises:
   a third layer consisting essentially of Ni and disposed on the second layer; and
   a fourth layer consisting essentially of a Ni-alloy and disposed on the third layer.

21. The apparatus of claim 14, further comprising drain leads coupled to the third electrode by bond wires.

22. The apparatus of claim 14, wherein the first electrode and the second electrode are each mounted on a heat sink by a diffusion solder bond.

23. The apparatus of claim 14, wherein the multi-layer contact structure further comprises at least one adhesion promotion layer disposed between the first layer and the second layer.

24. The apparatus of claim 23, wherein the adhesion promotion layer consists essentially of at least one of Ti and $TiN_x$.

25. The apparatus of claim 23, wherein the first layer comprises:
   a third layer consisting essentially of Ni and disposed on the adhesion promotion layer; and
   a fourth layer consisting essentially of a Ni-alloy and disposed on the third layer.

26. The apparatus of claim 14, wherein the semiconductor body is a semiconductor body of a MOSFET.

27. The apparatus of claim 26, wherein the second electrode is a control electrode of the MOSFET.

28. The apparatus of claim 14, wherein the semiconductor body is a semiconductor body of an IGBT.

29. The apparatus of claim 28, wherein the second electrode is a control electrode of the IGBT.

30. The apparatus of claim 14, wherein the semiconductor body is a semiconductor body of a vertical semiconductor power switch.

31. The apparatus of claim 30, wherein the second electrode is a control electrode of the vertical semiconductor power switch.

32. The apparatus of claim 14, wherein the first layer and the second conductive layer are in direct contact with each other, and wherein the second conductive layer is an aluminum layer.

33. The apparatus of claim 32, wherein an interface between the first layer and the second conductive layer comprises at least one intermetallic phase.

* * * * *